(12) United States Patent
Tabatabaei

(10) Patent No.: US 7,512,196 B2
(45) Date of Patent: Mar. 31, 2009

(54) SYSTEM AND METHOD OF OBTAINING RANDOM JITTER ESTIMATES FROM MEASURED SIGNAL DATA

(75) Inventor: Sassan Tabatabaei, Sunnyvale, CA (US)

(73) Assignee: GuideTech, Inc., Suunyvale, CA (US)

( * ) Notice: Subject to any disclaimer, the term of this patent is extended or adjusted under 35 U.S.C. 154(b) by 718 days.

(21) Appl. No.: 10/878,645

(22) Filed: Jun. 28, 2004

(65) Prior Publication Data

US 2005/0286627 A1    Dec. 29, 2005

(51) Int. Cl.
*H03D 1/04* (2006.01)
(52) U.S. Cl. .................................................. 375/346
(58) Field of Classification Search ................ 375/346, 375/224, 238, 260, 371; 702/69
See application file for complete search history.

(56) References Cited

U.S. PATENT DOCUMENTS

| | | | | |
|---|---|---|---|---|
| 4,757,452 A * | 7/1988 | Scott et al. | ............ | 702/69 |
| 4,908,784 A * | 3/1990 | Box et al. | ............ | 702/176 |
| 6,091,671 A * | 7/2000 | Kattan | ............ | 368/113 |
| 6,194,925 B1 * | 2/2001 | Kimsal et al. | ............ | 327/132 |
| 6,246,737 B1 * | 6/2001 | Kuglin | ............ | 375/371 |
| 6,298,315 B1 * | 10/2001 | Li et al. | ............ | 702/180 |
| 6,356,850 B1 * | 3/2002 | Wilstrup et al. | ............ | 702/69 |
| 6,832,172 B2 * | 12/2004 | Ward et al. | ............ | 702/69 |
| 6,898,535 B2 * | 5/2005 | Draving | ............ | 702/69 |
| 6,931,335 B2 * | 8/2005 | Mueller | ............ | 702/69 |
| 2004/0136450 A1 * | 7/2004 | Guenther | ............ | 375/226 |
| 2004/0158462 A1 * | 8/2004 | Rutledge et al. | ............ | 704/207 |

OTHER PUBLICATIONS

Technical Document—*Jitter Separation-50 Mb/s To Over 40 Gb/s Using the Agilent 86100C Infiniium DCA-J*; pp. 1 through 27, Agilent Technologies, Inc., Dec. 2003.
Technical Document—*Analyzing Jitter Using a Spectrum Approach*; pp. 1 through 8; Tektronix, Inc., 2002.

* cited by examiner

*Primary Examiner*—Juan A Torres
(74) *Attorney, Agent, or Firm*—Dority & Manning, P.A.

(57) ABSTRACT

A method of estimating random jitter from measured samples of a transmitted data signal includes a first step of obtaining a plurality of measurements (e.g., pulse widths) for selected signal edges within a transmitted data stream, where the data stream comprises a repeating data pattern having a known bit length and known number of rising edges, and wherein the time difference between adjacent measurements is determined by an event count increment equal to an integer multiple of the known number of rising edges. A time interval error (TIE) value is then computed for each measured signal edge and transformed into corresponding frequency components that are representative of both noise floor and multiple distinct frequency peaks. Noise floor is isolated and the power of the noise floor may be computed to provide an estimate of random jitter variance, from which the standard deviation may be calculated.

27 Claims, 7 Drawing Sheets

SYSTEM AND METHOD OF OBTAINING RANDOM JITTER ESTIMATES FROM MEASURED SIGNAL DATA

BACKGROUND OF THE INVENTION

In general, an integrated circuit refers to an electrical circuit contained on a single monolithic chip containing active and passive circuit elements. As should be well understood in this art, integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form almost all of the ordinary electronic circuit elements, such as resistors, capacitors, diodes, and transistors.

Integrated circuits are used in great quantities in electronic devices such as digital computers because of their small size, low power consumption and high reliability. The complexity of integrated circuits ranges from simple logic gates and memory units to large arrays capable of complete video, audio and print data processing. As the semiconductor industry strives to meet technological demands for faster and more efficient circuits, integrated circuit chips and assemblies are created with reduced dimensions, higher operating speeds and reduced energy requirements. As integrated circuit signal speeds increase, timing errors and pulse width deviations within such signals may constitute a greater portion of a signal period than the signal itself.

Timing fluctuations in integrated circuit signals are generally referred to as "jitter". Jitter can be broadly defined in certain interpretations as variation of a signal edge from its ideal position in time, and is an important performance measure for integrated circuit signals, including serial links and clock signals. For serial link qualification, jitter is decomposed into its various components, which are generally divided into two types, deterministic and random. The impact of each jitter component on bit error rate (BER) performance is different. Deterministic jitter contributes mainly to BER levels down to about $10^{-5}$, whereas random jitter contributes mainly to BER performance for levels below $10^{-5}$.

Deterministic jitter is bounded and may be correlated to known sources such as supply voltage fluctuations, control-system instability, temperature variation, noise and the like. Deterministic jitter has two main contributing portions, namely periodic jitter (PJ) and data-dependent jitter (DDJ). DDJ behaves as a high-frequency jitter that is strongly correlated to a data stream's bit pattern. One or both of inter-symbol interference (ISI) and duty-cycle distortion (DCD) contribute to DDJ.

Random jitter, as opposed to deterministic jitter, is unbounded and is due to sources that can only be characterized statistically. Random jitter is not periodic, dependent on a data pattern, or correlated to known deterministic sources. Random jitter is modeled as a random process with a normal or Gaussian probability distribution function (pdf). However, in some applications, random jitter may contain non-Gaussian components, e.g., due to coupling from other data links carrying uncorrelated data. Such random components are often referred to as bounded uncorrelated jitter (BUJ).

The measurement and determination of signal jitter, including the various components thereof, is imperative in characterizing the performance of integrated circuits, especially in the production and testing stages of integrated circuit manufacturing. Various devices, including time interval analyzers, counter-based measurement devices and oscilloscopes, have been developed to measure various signal timing deviations, including jitter.

An example of a time interval analyzer that may be employed to measure high frequency circuit signals and determine various aspects of signal timing deviations is disclosed in U.S. Pat. No. 6,091,671 (Kattan), which is assigned to the present applicants' assignee, Guide Technology, Inc. The time interval analyzer disclosed in Kattan measures jitter, including total cycle-to-cycle jitter, by determining deviations between one or more of the amplitude, phase, and/or pulse width of real signal pulses and ideal signal pulses.

Other examples of time measurement devices that could be configured to measure signal timing variations are disclosed in U.S. Pat. No. 6,194,925 (Kimsal et al.) and U.S. Pat. No. 4,757,452 (Scott et al.) Kimsal et al. discloses a time interval measurement system in which a voltage differential across a hold capacitor generated between events occurring in an input signal determines the time interval between events. Scott et al. provides a system for measuring timing jitter of a tributary data stream that has been multiplexed into a higher-rate multiplex stream using pulse stuffing techniques. Scott et al. is an event counter based system that does not directly measure time intervals but determines their frequency by maintaining a continuous count of the number of pulses occurring within a signal. Still further, U.S. Pat. No. 4,908,784 (Box et al.) discloses a measurement apparatus configured to measure the time interval between two events (start and stop) through counters.

As referenced above, several devices exist for measuring signal properties, including timing variations such as total signal jitter. However, specific types of signal analysis must be applied to signal measurements in order to extract the different components of a signal (e.g., jitter signal) so that the source of jitter can be more easily characterized. U.S. Pat. No. 6,356,850 (Wilstrup et al.) discloses features and steps for separating the components of a jitter signal, including the random and periodic components of the jitter signal. U.S. Pat. No. 6,298,315 (Li et al.) discloses features and steps for separating and analyzing the random and deterministic components of a distribution using tail-fitting steps and estimation of associated statistical confidence levels.

Although the above examples and others exist for measuring and analyzing various aspects of signal jitter, no one design exists that encompasses all features and aspects of the present invention.

All the aforementioned patents are incorporated herein by reference for all purposes.

SUMMARY OF THE INVENTION

In view of the recognized features encountered in the prior art and addressed by the present subject matter, features and steps for estimating the random jitter component of measured data have been developed. Varied exemplary embodiments of a system and method for obtaining random jitter measurements are hereafter presented, selected of which offer such advantages as providing a relatively fast and robust method that is independent of periodic jitter (PJ) determinations. Furthermore, the subject system and method provide relatively consistent repeatability regardless of the amounts of PJ and data-dependent jitter (DDJ) in measured signal jitter.

In one exemplary embodiment of the present invention, a method of estimating random jitter from measured samples of a transmitted data signal includes a first step of obtaining a plurality of measurements (e.g., pulsewidths) for a plurality of selected signal edges within a transmitted data stream. The data stream may correspond to a repeating data pattern having a known bit length and known number of rising edges. The step of obtaining a plurality of measurements may be effected such that the time difference between adjacent measurements is determined by an event count increment equal to an integer multiple of the known number of rising edges in the repeated data stream, thus creating a uniform sampling environment which may more easily accommodate subsequent transformation steps from time to frequency domain. Furthermore, by measuring the same selected edge(s) or data pulse in a known repeating data pattern, data-dependent jitter can be eliminated or significantly minimized from the obtained measurements. This initial measurement step may be effected by one or more measurement channels of a time measurement device such as a time interval analyzer.

After selected signal measurements are obtained, a time interval error value is then computed for each measured signal edge. In one particular embodiment, time interval error values are calculated by obtaining a unit interval value corresponding to the average bit rate for the transmitted data stream, computing an ideal edge timing for each measured signal edge, and determining the difference between the calculated ideal edge timing and the actual measured timing for each measured signal edge.

Time interval error values are then transformed into corresponding TIE frequency components (via, for example, a fast Fourier transform, or FFT) for selected of the measured signal edges, wherein the TIE frequency components are representative of both noise floor as well as multiple distinct frequency peaks. Noise floor is separated from the multiple distinct frequency peaks representative of periodic jitter by replacing each TIE frequency component greater than a predetermined value with a lower predetermined replacement value. The power of the noise floor may be computed to provide an estimate of random jitter variance, from which the standard deviation may be calculated.

The above exemplary steps may be obtained for multiple measured data sequences, providing multiple estimates of RJ standard deviation. Averaging such multiple estimates may provide a more accurate estimate of the actual RJ component present in a jitter signal.

It should be appreciated that the present subject matter equally concerns an apparatus and system for implementing the aforementioned exemplary steps. For example, a processor circuit may be coupled to the measurement channel that obtains the signal measurements and configured to perform such steps as determining the time interval error for selected measurements, transforming selected of the time interval error values into corresponding frequency domain components, separating noise floor from distinct frequency peaks in the transformed frequency domain components, and computing the power in the noise floor within the frequency components.

In one embodiment, such a processor circuit more particularly includes a computer-readable medium for storing executable instructions corresponding to the aforementioned steps and other steps desired in the subject signal analysis. The computer-readable medium may correspond to one or more of a server database, a magnetic tape or disk, a CD-ROM, a flash or other nonvolatile memory, etc. The exact type of memory or storage medium should not be limiting to the present invention. The processor circuit further includes a computer coupled to the readable medium that is adapted to execute the software instructions stored on the computer-readable medium.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Figure 1:
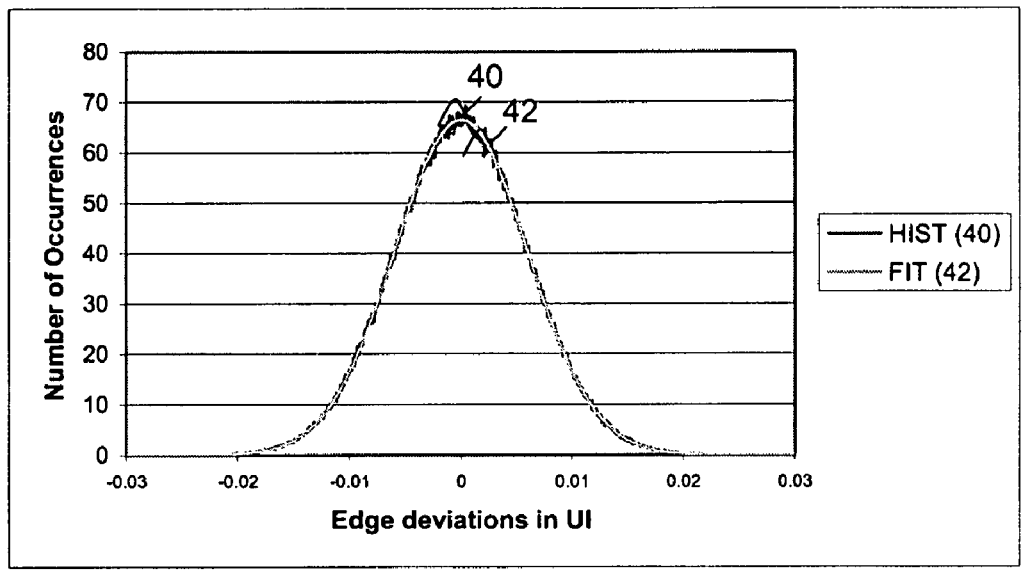
FIG. 1 provides a graphical representation of a known tail fit type plot for a histogram that only includes random jitter components of an exemplary signal transmission.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, one or more examples of which are illustrated in the accompanying drawings. Each example is provided by way of explanation of the present technology, not limitation of the present technology.

In fact, it will be apparent to those skilled in the art that modifications and variations can be made in the present technology without departing from the scope and spirit thereof. For instance, features illustrated or described as part of one embodiment may be used on another embodiment to yield a still further embodiment. Thus, it is intended that the present subject matter covers such modifications and variations as come within the scope of the appended claims and their equivalents.

As previously mentioned, jitter is generally divided into two types, deterministic and random. Deterministic jitter is bounded and may be correlated to known sources such as supply voltage fluctuations, control-system instability, temperature variation, noise and the like. Deterministic jitter has two main contributing portions, namely periodic jitter (PJ) and data-dependent jitter (DDJ). One or both of inter-symbol interference (ISI) and duty-cycle distortion (DCD) contribute to DDJ. Random jitter (RJ), on the other hand, is unbounded and is due to sources that can only be characterized statistically. Aspects of the present invention will be generally directed to the measurement and analysis of RJ.

RJ is often characterized by its standard deviation $\sigma_{RJ}$, therefore, RJ estimation methods typically try to provide an accurate estimate of $\sigma_{RJ}$. Different known methods of estimating $\sigma_{RJ}$ exist, including "pdf or histogram tail fit", "BER bathtub curve", "frequency domain" and "TIE frequency domain" methods. Aspects of these known techniques for estimating RJ will now be described with respect to FIGS. 1-4, respectively, which are indicated as prior art since the graphical representations illustrate aspects of known methods for modeling components of a jitter signal, especially random jitter.

Referring now to FIGS. 1-4, aspects of "pdf or histogram tail fit" method are described. It should be appreciated by one of ordinary skill in the art that a histogram provides an estimate of a probability distribution function (pdf) of a signal or process. It is formed by dividing a given sample set range into a number of bins and plotting the number of samples occurring in each bin versus the center of that bin. Although "pdf tail fitting" can produce fairly accurate estimates with a reasonable number of data samples when DDJ and PJ are small, it requires very large sample sets and careful selection of histogram bins to provide reasonably accurate and precise (repeatable) results in the presence of DDJ and PJ. Aspects of this phenomenon are demonstrated in FIGS. 1-3, respectively.

The plot in FIG. 1 shows a histogram (HIST) representation that only includes RJ. The histogram is represented in FIG. 1 by plot 40, while plot 42 represents a Gaussian distribution (FIT) that is relatively easy to fit to the histogram plot 40 since all samples in the histogram are used for estimation of RJ.

Figure 2:
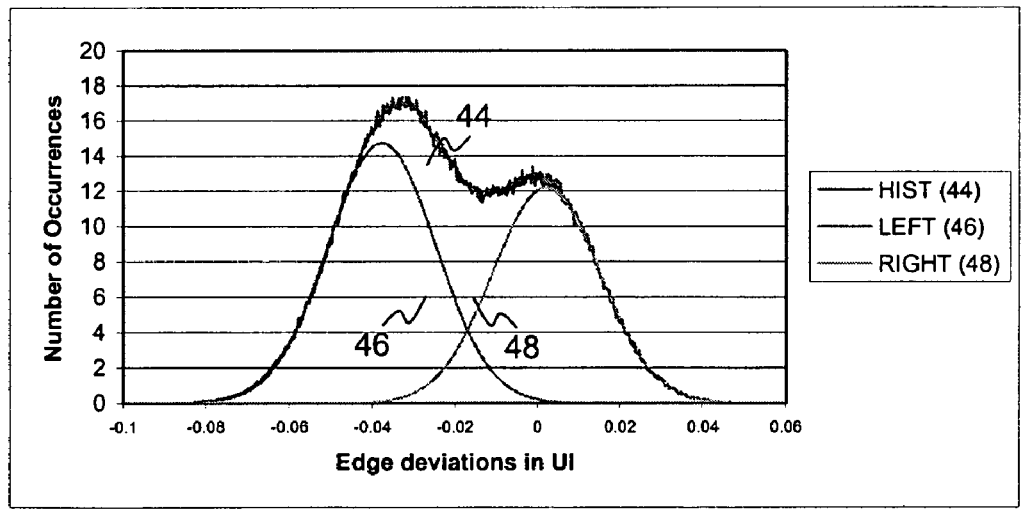
FIG. 2 provides a graphical representation of a known tail fit type plot for a histogram that includes random jitter and data-dependent jitter components of an exemplary signal transmission.

The plots of FIG. 2 demonstrate an exemplary histogram when RJ and DDJ exist simultaneously. The histogram (HIST) is represented by plot 44, while plots 46 and 48 respectively represent left and right tail fitting Gaussian distributions for estimating the random jitter components of the transmitted signal. The histogram representation of FIG. 2 includes RJ and DDJ (no PJ), and the DDJ dominates the middle portion of the graph, for example in the x-axis range from about −0.04 to about 0. The left and right tail portions exhibit a substantially Gaussian behavior, and corresponding fits of Gaussian distributions to the left and right respective tails provide two estimates of the RJ standard deviation. The average of these estimates can be used as $\sigma_{RJ}$. In FIG. 2, approximately twenty percent of the total samples fall into the left and right tail regions for use in estimation of RJ. Since a lack of sufficient samples in the respective tail regions deteriorates the RJ estimation precision, more samples are needed to increase precision.

Figure 3:
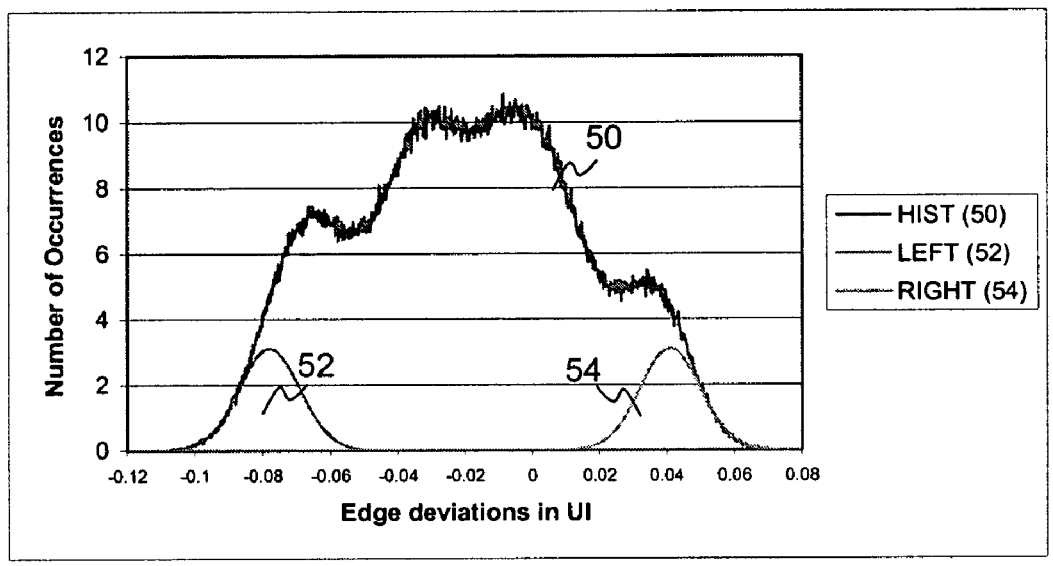
FIG. 3 provides a graphical representation of a known tail fit type plot for a histogram that includes random jitter, data-dependent jitter and periodic jitter components of an exemplary signal transmission.
Figure 4:
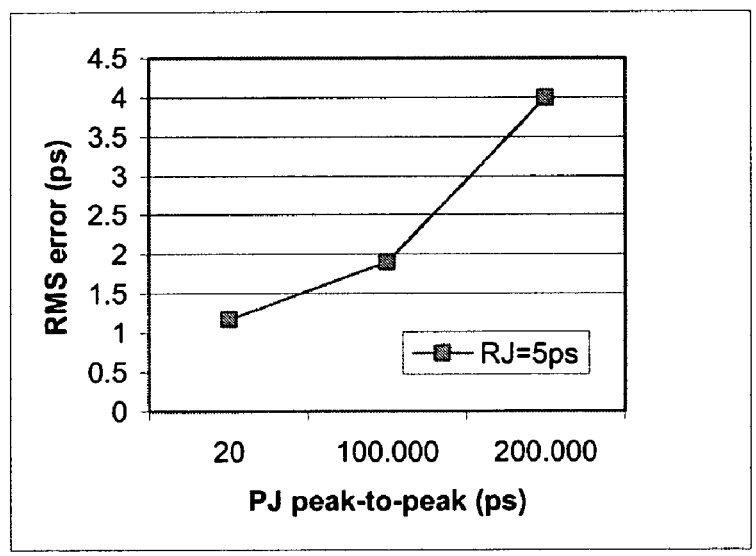
FIG. 4 provides an exemplary graphical illustration of tail fit estimation RMS error versus the peak-to-peak periodic jitter for a given amount of random jitter.

FIG. 3 shows an exemplary histogram for data transmitted over a 1 Gbps (Gigabit per second) serial link, which includes DDJ, RJ, and a significant amount of PJ. DDJ and PJ dominate the middle portion of the histogram (HIST) represented by plot 50 while the tails exhibit a substantially Gaussian behavior. Again, fitting Gaussian distributions to the left and right tails provide two estimates of the RJ standard deviation ($\sigma_{RJ}$). The average of these estimates can then be used as an overall estimate of $\sigma_{RJ}$. An exemplary left Gaussian fit is represented by plot 52, while an exemplary right Gaussian fit is represented by plot 54. It can be seen in FIG. 3 that significant amounts of PJ will affect the curvature of the tail regions in a histogram, thus potentially causing a systematic error in estimating the real RJ. The plot of FIG. 3 illustrates that the tail fit occurs only at the extreme end portions of the respective right and left tail portions of the histogram, which further deteriorates accuracy and precision. FIG. 4 provides a graphical representation of the exemplary RMS error (in picoseconds) that results from the impact of PJ for different peak-to-peak values of PJ (also in picoseconds) and a fixed RJ of five picoseconds (5 ps).

Another known method of estimating $\sigma_{RJ}$ is sometimes referred to as a "BER bathtub curve" method. Plots of the bit error rate (BER) versus sampling delay are generally known as bathtub curves and contain RJ information. Typically, the portion of such a curve above a BER of about $10^{-5}$ is dominated with DDJ and PJ, while the lower portions are mainly due to RJ. The effect(s) of deterministic jitter (DJ), which includes both DDJ and PJ, primarily manifests itself as shifts in the horizontal axis, while RJ impacts the slope of the curve in the often relatively steep portion below $10^{-5}$. Therefore, measuring BER for two or more sampling delays provides enough information to measure RJ by estimating the slope in the steep region. The bathtub curve method requires high-performance data recovery equipment to measure BER. It is also slow because of the need to obtain multiple BER measurements. This method is generally suited for characterization application with bit error rate test (BERT) equipment, or for use along with Design-for-Test (DFT) methodologies for serial I/O that includes modification to both transmitter and receiver links.

Yet another known method for estimating $\sigma_{RJ}$ is referred to as the "frequency domain" method, and is based on the observation that jitter is effectively unwanted phase modulation. This phase modulation can be estimated by observing the signal frequency components with a spectrum analyzer. RJ causes spectrum spreading around the main carrier, often decreasing with a slope of 20 dB/dec. The ratio of the power underneath the spectrum around the carrier to the main carrier power provides an estimate of RJ. Typically, the main carrier is eliminated using a mixer to observe phase noise frequency spectrum more clearly. The frequency domain method, however, is difficult to use for the test of digital serial links, because AM modulation may erroneously be attributed to jitter. It is also difficult to separate different jitter components in accordance with the frequency domain method.

A still further known method for estimating $\sigma_{RJ}$ is referred to as a time interval error (TIE) frequency domain method. High-speed real time sampling oscilloscopes are capable of estimating TIE for a record of consecutive edges of the signal. This record can be viewed in the frequency domain using a fast Fourier transform (FFT). This is equivalent to observing a phase modulation signal in the frequency domain. The PJ and DDJ will appear as distinct spectral lines. If these spectral lines are eliminated, the remaining noise floor power provides an accurate estimate of RJ. For using this method special care has to be taken for selecting the record length and frequency resolution. For long patterns, the DDJ spectral lines tend to distribute over a large number of frequencies and with amplitudes that decrease to the noise floor levels. Under such conditions, the DDJ contributions to the noise floor will introduce error in RJ estimation.

In light of the potential problems associated with the aforementioned known methods for determining random jitter estimates for a measured signal, features and steps associated with obtaining random jitter have been developed in accordance with certain embodiments of the present invention.

Figure 5:
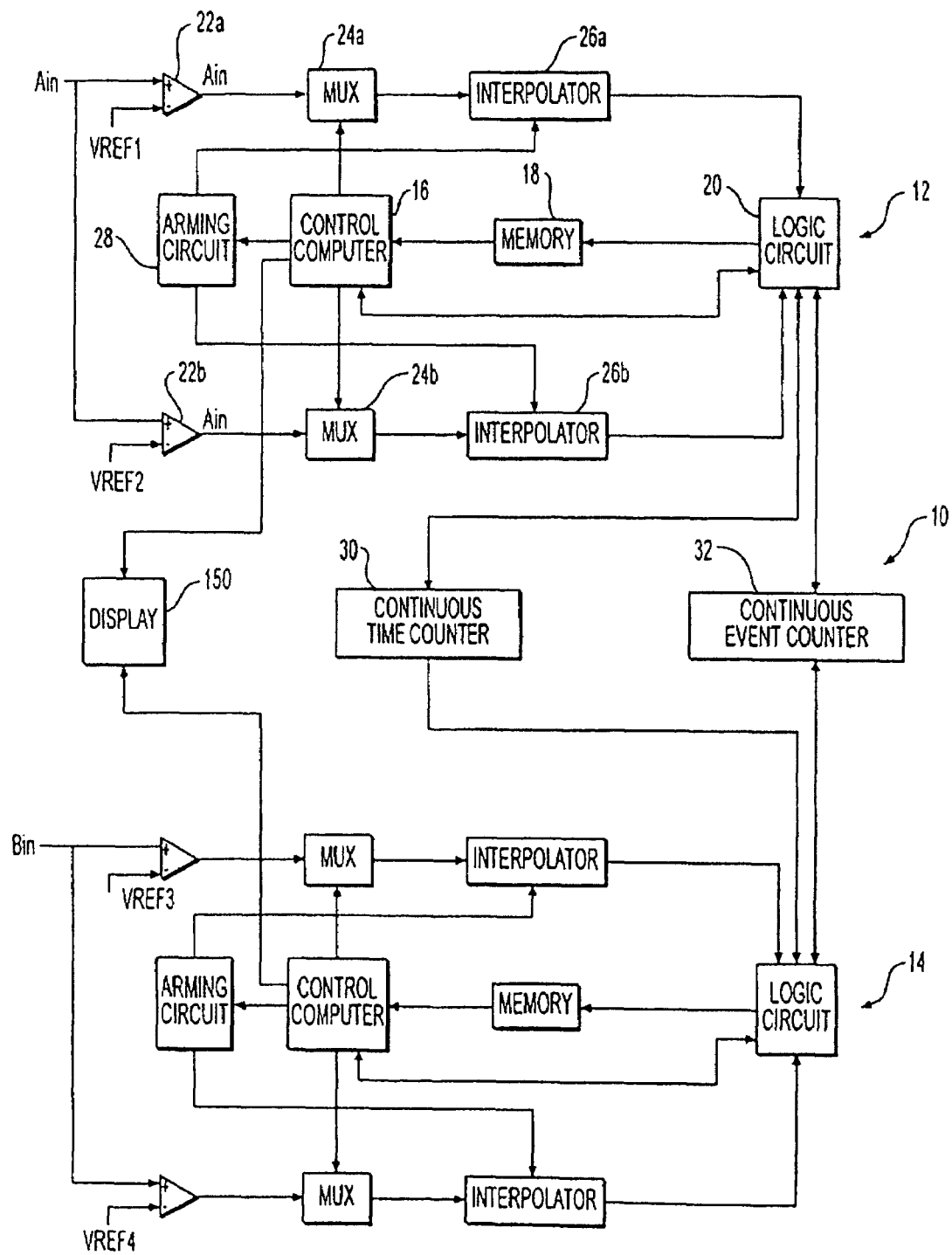
FIG. 5 provides a schematic diagram illustration of exemplary hardware components for obtaining and analyzing signal measurements in accordance with aspects of the present invention.

Referring now to FIG. 5, a schematic representation of exemplary hardware components for obtaining and analyzing signal measurements in accordance with aspects of the present invention is provided. The hardware components illustrated in FIG. 5 are exemplary of those found in a FEMTO® 2000 or GT 4000 model time interval analyzer such as manufactured and sold by Guide Technology, Inc. of Sunnyvale, Calif. Although some aspects of the hardware components of FIG. 5 are discussed herein, additional discussion of these and other components of a measurement device that may be utilized in conjunction with certain aspects of the present invention are disclosed in U.S. Pat. No. 6,091,671 (Kattan), which is incorporated herein by reference for all purposes.

The time interval analyzer 10 of FIG. 5 includes two channels indicated at 12 and 14. Each channel includes a control computer 16, for example a 200 MHz DSP processor, with associated memory 18, for example a high performance FIFO memory, and logic circuit 20. Alternatively, the channels may share a common computer, memory and logic circuit, which may collectively be referred to as a processor circuit. Each channel, in turn, includes parallel measurement circuits having comparators 22a and 22b, multiplexers 24a and 24b and interpolators 26a and 26b. That is, each channel includes multiple, in this case, two measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter, provided that the respective counters for each measurement circuit are synchronized.

The first measurement circuit 22a-26a/20 of each channel may be referred to as the "start" measurement circuit, while the second measurement circuit 22b-26b/20 may be referred to as the "stop" measurement circuit. Generally, time interval analyzer 10 measures characteristics of a desired signal by comparing the time and/or event measurements of the start circuit with that of the stop circuit. The particular measurement depends upon the signal selected at multiplexers 24a and 24b and upon the manner in which arming circuit 28 arms the interpolators. For example, if the start circuit passes the $A_{in}$ signal from comparator 22a as shown in FIG. 5, if the stop circuit multiplexer passes the inverse of the $A_{in}$ signal from comparator 22b, and if the interpolator 26b is armed immediately following interpolator 26a, but before the expiration of a period equal to the input signal pulse width, the difference between the time portions of the start and stop measurement tags is equal to the pulse width.

Once an interpolator has measured a signal edge, the logic circuit 20 instructs computer 16 to read the interpolator measurement from a capacitor within the interpolator whose charge or discharge is representative of a time signal that corresponds to the occurrence of the measured signal edge relative to a predetermined time reference. Computer 16 is also instructed to read the time and event counts from counters 30 and 32. It then downloads the time and event counts to memory 18, from which computer 16 retrieves the information to assign to the signal measurement. In this manner, the processor circuit correlates the measured signal edge with time and event measurements from the counters. Thus a "measurement tag" indicates the time the signal edge occurred and the edge's position within the sequence of edges. Control computer 16 repeatedly reads the memory to perform a desired analysis and/or to display the measured information at a display device 150, for example a video monitor.

Time interval analyzers such as the one illustrated in FIG. 5 are capable of generating time interval error (TIE) data as well as absolute time tags (referenced to the first sample) for selected edges within a data stream. TIE can be generally described as the time displacement between a given signal edge (or event) and its ideal location determined from an average unit interval, or average bit time. The sampling rate of a data stream is typically much less than the bit rate for a data stream since the measurement circuitry must have an opportunity to settle and recharge (or discharge) after a given measurement to ensure the accuracy of a subsequent measurement. Since the sampling rate is lower than the bit rate, TIE data obtained by a time interval analyzer is effectively an undersampled sequence of total TIE. The undersampled TIE, however, still can be used in conjunction with the time tags to provide accurate estimates of random jitter (RJ). One method of doing so is to isolate RJ by eliminating the effect of DDJ+DCD and PJ. More particular aspects of such a method will now be presented with respect to FIGS. 6 and 7.

A first exemplary step 60 in accordance with a method of obtaining random jitter signal measurements is to obtain a plurality of measurements for a number of edges in a known data pattern (e.g., one with a known bit stream of a given length that is periodically repeated). The measurements should be taken such that the time difference between two adjacent samples of the same pattern edge is approximately constant. This yields a uniform sampling environment that accommodates subsequent performing of a fast Fourier transform (FFT) on the measured data samples. A next step that may be needed after step 60 when DDJ is potentially present in the measurements obtained via step 60 is to eliminate the DDJ by computing DDJ for each pattern edge and subtracting it from the total set of data measured in step 60 for the relevant edges.

The need for a step to eliminate DDJ from the measured data samples may be avoided by creating a uniform sampling environment that simultaneously eliminates DDJ. This may be accomplished for a transmitted data stream having a known repetitive pattern by ensuring that the event count increment (detected number of rising edges) between one measurement sample and the next is a multiple of the number of rising edges in the known repeating pattern. For example, if the repeatedly transmitted data pattern has a bit length of twenty bits and five rising edges within the data pattern, the event count increment should be set to 5M, where M is an integer. M may often be limited to an integer having a value great enough to ensure that measurement circuitry will be fully enabled between subsequent measurements. Thus, M may often be one or more orders of magnitude greater than the number of pulses in the transmitted data pattern.

In one embodiment of the present method, pulse widths are measured in a uniform sampling environment with simultaneous elimination of DDJ. A time interval mode that establishes what input signals and corresponding measurements to obtain is configured such that measurements are obtained for selected rising edges within a transmitted data signal and the immediately subsequent respective falling edges. Such "pulse width" mode may be effected in a similar manner as described above with respect to FIG. 5, whereby a start measurement circuit in a given measurement channel measures a given rising edge and the stop measurement circuit in the same channel measures the immediately subsequent falling edge. DDJ is eliminated from the measured pulse width samples by ensuring that the number of events (rising edges) between start of two consecutive pulse widths is a multiple of the number of events in the repeating data pattern. Establishing of the event count increment in such a fashion enables the start of all measured pulse widths to fall on the same pattern edge. This eliminates the impact of DDJ since only samples of one rising edge and one falling edge in the pattern are measured. It should be appreciated that many other sampling procedures are also possible.

Step 60 may be referred to herein with reference to some embodiments of the present invention as time domain DDJ deconvolution since the effects of DDJ are eliminated from the measurement data. With further reference to exemplary step 60 of illustrated in FIG. 6, it should be appreciated that certain advantages are effected by employing an event count increment to obtain the repeated sampling of the same edge(s) in a data pattern. By monitoring the event count within the data signal and effecting a predetermined event count increment between measurement samples, no pattern marker signal is needed. In contrast, the marker that identifies when a signal is to be measured is embedded within the data pattern itself.

Figure 10:
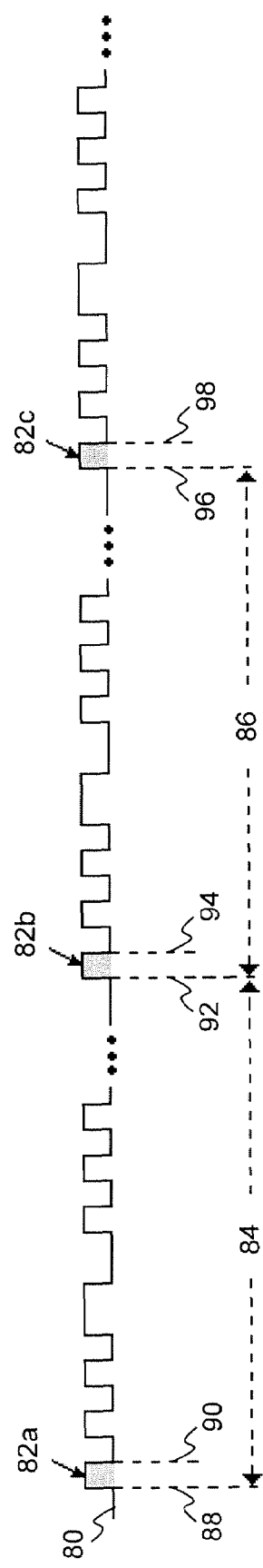
FIG. 10 provides a graphical illustration of an exemplary data signal showing start and stop edges associated with exemplary pulse width measurements obtained for a repeating data pattern in accordance with the presently disclosed technology.

An example of a data signal measured via step 60 is depicted in FIG. 10, which illustrates measured portions of a data signal 80. Signal 80 consists of a 15-bit pattern (namely, the sequence represented in binary format as [101010110010101]) that is repeatedly transmitted. In accordance with the aforementioned techniques for creating a uniform sampling environment, a single pulse in the known data pattern is chosen for measurement, namely pulse 82. First, second and third measured occurrences of pulse 82 are represented as pulses 82a, 82b and 82c, respectively. The time duration 84, 86, etc. between subsequent measurements of pulse 82 is determined based on an event count increment equal to 7M, where M is an integer value as previously described and 7 is the number of rising edges in the known 15-bit data pattern of signal 80. In one example of the subject methodology, a sequence of N measurements are obtained for multiple pulse widths from 82a, 82b, 82c, . . . 82N. For each pulse iteration, measurements of the rising and falling edges of the designated pulse may be obtained. For example, measurements of pulse width 82a include a time stamp $t_{start}(0) = t_{st}(0)$ at rising edge 88 and a time stamp $t_{stop}(0) = t_{sp}(0)$ at falling edge 90. Measurements of pulse width 82b may include a time stamp $t_{st}(1)$ at rising edge 92 and a time stamp $t_{st}(1)$ at falling edge 94. Measurements of pulse width 82c may include a time stamp $t_{st}(2)$ at rising edge 96 and a time stamp $t_{sp}(2)$ at falling edge 98. Event counts for each measured rising or falling signal edge may also be obtained in addition to each time stamp. It should be appreciated that the actual type of measurements obtained may correspond to such information as one of rising edges, falling edges, signal periods, pulse widths, duty cycle or any combination of such multiple measurement types.

Figure 6:
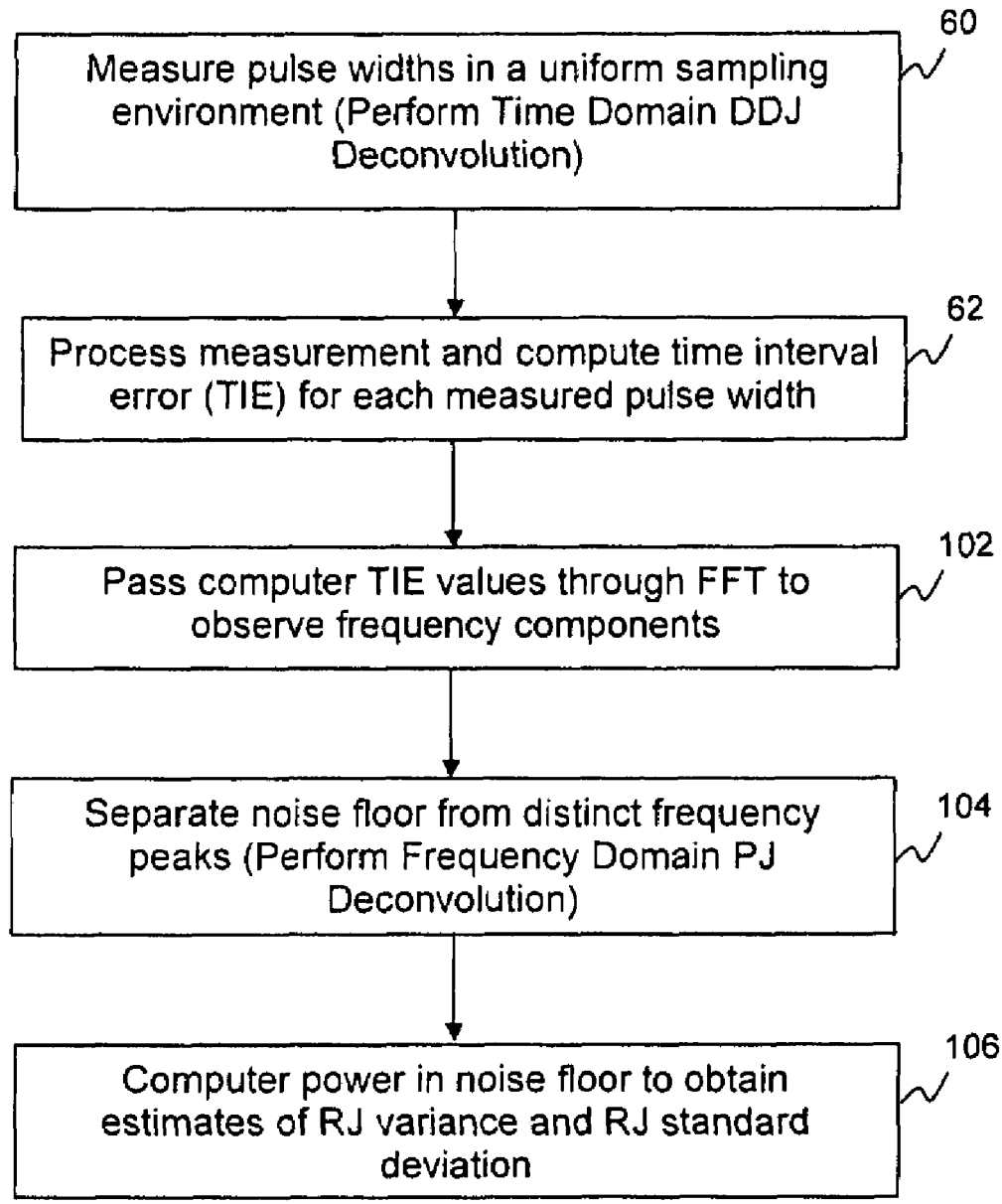
FIG. 6 provides a block diagram of exemplary steps in a method of obtaining random jitter estimates in accordance with aspects of the present invention.

Referring still to FIG. 6, a next step 62 in the exemplary method of obtaining a random jitter estimate for signal measurements corresponds to processing the measurements and computing the time interval error (TIE) for each measured rising edge or for each measured pulse width. More particular aspects of step 62 will now be presented with respect to FIG. 7. A first step 64 in accordance with the processing of the data samples measured in step 60 is to determine a single number estimate of the unit interval (UI), also defined as the average bit rate for the transmitted signal. An estimate of UI may be obtained via the following formula:

$$UI = \frac{t(N) - t(0)}{E(N) - E(0)}, \quad (1)$$

where N is the total number of samples obtained in step 60. The function t(i) is defined as the time tag obtained for measured sample i, and the function E(i) is defined as the event number for measured sample i.

A next step 66 in the processing of step 62 corresponds to computing an ideal edge timing from the UI estimate obtained in step 64. Ideal edge timing $t_{ideal}(i)$ may be computed by the following:

$$t_{ideal}(i) = (E(i) - E(0)) \cdot \frac{patLen}{ppat} \cdot UI, \quad (2)$$

where patLen is the pattern length in bits, ppat is the number of rising edges in the pattern, UI is as defined in Equation (1) and the functions for E(i) and t(i) respectively correspond to the Event number and time tag for the i-th measurement.

Figure 7:
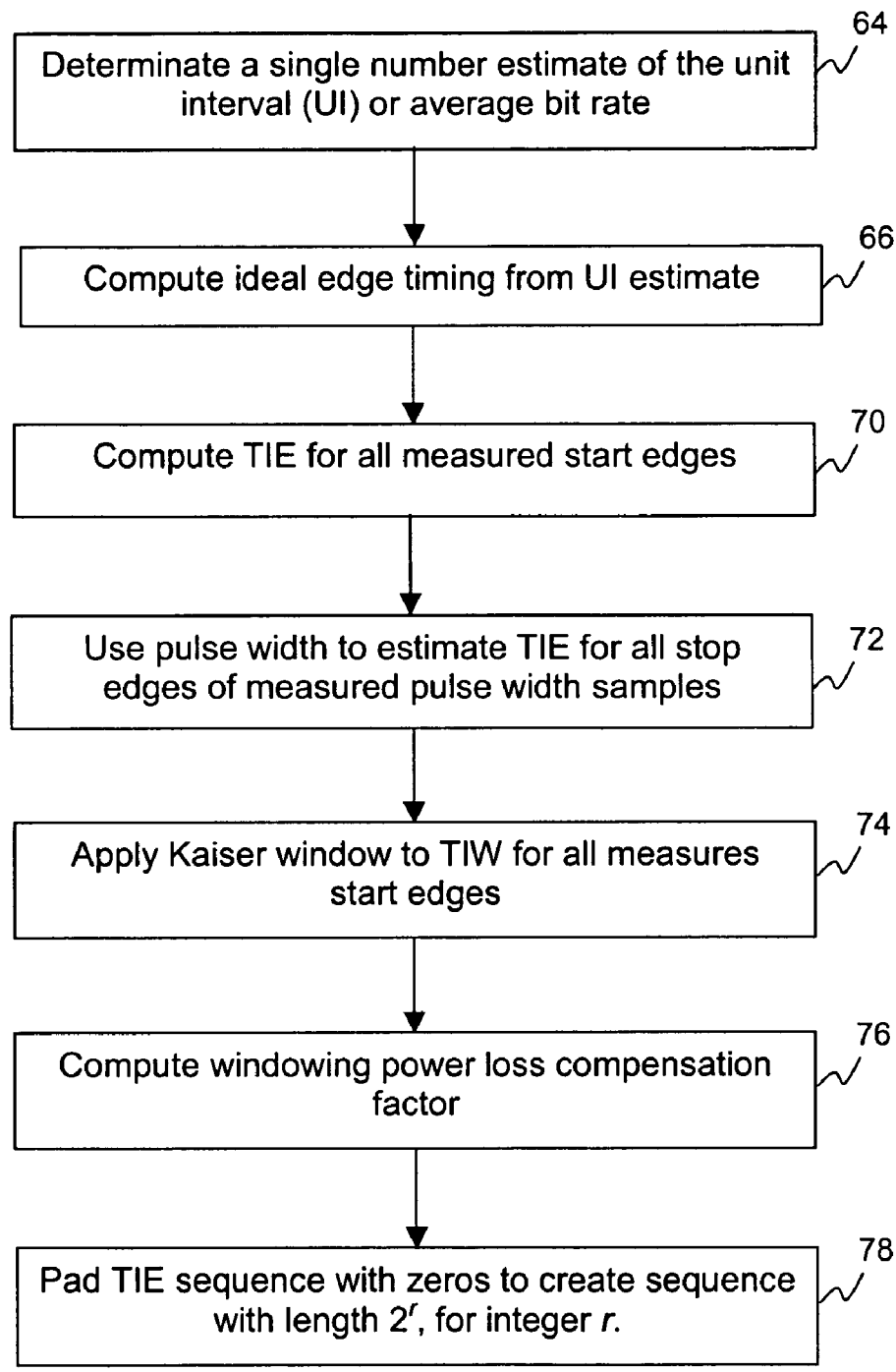
FIG. 7 provides a block diagram of exemplary processing steps in accordance with more particular aspects of the random jitter estimation method of FIG. 6.

Referring still to FIG. 7, exemplary step 70 may correspond to computing the time interval error (TIE) for all edges in t (the start edges of all measured pulse widths). The UI estimate from equation (1) may be used to estimate the ideal edge location via Equation (2) and for each element of t is then subtracted from the time tag for each measured sample via the following:

$$TIE_{st}(i) = t(i) - t_{ideal}(i). \quad (3)$$

The pulse width is then utilized in step 72 to estimate the TIE for the stop edges of the pulse widths measured in step 60. To do so, the UI span for the pulse width is estimated from round(P(i)/UI), where round(x) rounds x to its nearest integer and P(i) is defined as the pulse width for measured sample i. More particularly, the TIE for all stop edges is computed by:

$$TIE_{sp}(i) = t(i) + p(i) - t_{ideal}(i) - \text{round}(P(i)/UI) \quad (4)$$

A windowing function w(i) may then be applied in exemplary step 74 to the $TIE_{st}(i)$ sequence, i.e., to the TIE values for all start edges measured in step 60 as follows:

$$TIE_{Wst}(i) = TIE_{st}(i) \cdot w(i), \quad (5)$$

A still further processing step 76 corresponds to computing a windowing power loss compensation factor $k_2$ as follows:

$$k_2 = \sqrt{\frac{N}{\sum_{m=1}^{N} [w(m)]^2}}, \quad (8)$$

after which an exemplary step 78 may be effected to pad the sequence $TIE_{Wst}(i)$ with zeros to obtain a sequence with a length of power of two defined by $2^t$ and where t is an integer chosen such that $2^t$ is greater than but as close as possible to N. The padding in step 78 is performed as follows:

$$TIE_{WOst}(i) = \begin{cases} TIE_{Wst}(i) & i \leq N \\ 0 & N < i < 2^t \ (t \ \text{an integer}) \end{cases} \quad (9)$$

Referring again to FIG. 6, a next step 102 in the exemplary method for obtaining random jitter estimates of measured data is to transform the TIE samples into frequency domain components. This may be done, for example, by computing a fast Fourier transform (FFT) for each obtained TIE value such that the frequency components of such values can be observed. In a more particular embodiment of exemplary step 102, the FFT of $TIE_{WOst}$ (i) is defined as follows:

$$TIE_{st\_fft}(i) = FFT[TIE_{WOst}] \quad (10)$$

Passing samples through the FFT of equation (10) yields a sequence with PJ showing as distinct peaks and RJ appearing in noise floor. Step 104 may then be employed to separate noise floor from distinct frequency peaks. More particularly, by attenuating the distinct frequency peaks seen after performing the FFT via equation (10), PJ is eliminated leaving only noise floor as a remaining component. One example of how to implement step 104 would be to consider the magnitudes of the resulting samples after having been transformed into the frequency domain in step 102. Frequency components having a magnitude greater than some predetermined value may be replaced by lower predetermined or calculated replacement value. One example of a replacement value would be to determine an average value of the magnitudes for selected adjacent samples. Such an operation eliminates PJ peaks and provides a representation of the noise floor. The result of steps 102 and 104 may be referred to as $TIE_{st\_fft\_mag\_noPeak}(i)$.

The effects of steps 102 and 104 may be referred to herein as frequency domain PJ deconvolution. It should be appreciated that the use of frequency domain transformations, such as FFTs, in step 102 can be applied to any timing information as long as the uniform sampling condition is satisfied. For example, FFTs or other transformation techniques can be applied to TIEs calculated for specific signal edges as described above, or can also be applied directly to pulse widths or other uniformly sampled timing measurements.

Referring again to FIG. 6, a final step 106 in the subject method for determining RJ estimates for measured data is to compute the power in the noise floor remaining after the frequency domain PJ deconvolution of steps 102 and 104. Power may be calculated by the following formula:

$$TIE_{st\_fft\_mag\_noPeak\_pwr} = \frac{\sqrt{Trap(TIE_{st\_fft\_mag}^2)}}{\sqrt{N \cdot N_0}} \cdot k_2 \quad (13)$$

where, Trap( ) is an integration function based on simple trapezoidal method, $N_0$, is the number of elements in $TIE_{st\_fft\_mag}(i)$, and N is the number of elements in the original TIE sequence $TIE_{st}(i)$ (before zero-padding, if applicable). It should be appreciated that integration can be performed via a plurality of other methods as opposed to the simple trapezoidal method defined in equation (13). The power calculated in equation (13) provides an estimate of RJ variance. The square root of the RJ variance will then yield RJ standard deviation ($\sigma_{RJ}$), or simply RJ.

The RJ value determined above is an estimate based on the start edges of the measured pulse width data samples. Since TIE for all corresponding stop edges was calculated in step 72, steps 74 through 78 and 102 through 106, respectively, may be repeated for the stop edge sequence to obtain yet another sample estimate of FFT noise floor, $TIE_{sp\_fft\_mag\_noPeak\_pwr}$. With two estimates available, the average value of the two noise floor estimates may be computed by:

$$RJ = \frac{TIE_{st\_fft\_mag\_noPeak\_pwr} + TIE_{sp\_fft\_mag\_noPeak\_pwr}}{2},$$

at which point RJ estimation is complete. It should be appreciated that still further RJ estimates may be obtained. By averaging the RJ estimates from different FFT sequences, the overall estimation accuracy is typically improved.

In accordance with the methods described above with respect to FIGS. 6 and 7, it should be appreciated that a variety of different physical apparatuses may be employed to effect the various steps described in such methods. For example, the measurements obtained in step 60 may be made by the interpolators and related components illustrated and described with regard to the time interval analyzer 10 of FIG. 5. Alternatively, other time measurement devices such as those disclosed in U.S. Pat. No. 6,194,925 (Kimsal et al.), U.S. Pat. No. 4,757,452 (Scott et al.) or U.S. Pat. No. 4,908,784 (Box et al.) or still others may be utilized to obtain the measured data samples.

Subsequent processing steps such as outlined in steps 62 through 78 and 102 through 106, respectively, may be implemented, for example, in a computer program that may be stored and executed via a computer or other processor circuit coupled to the time measurement device. For example, referring to FIG. 5, memory 18 may be used to store the execution code embodying the program steps and control computer 16 may execute the program steps after measurements are obtained. In other embodiments, the processing steps are embodied by a computer program that may be stored on a computer readable medium such as a separate server, a magnetic disk or tape, a CD-ROM, flash memory, or other storage device resident on a PC or networked peripheral device and is executed by a computer workstation separate from control computer 16. Such a computer workstation may be provided with additional functionality than provided in control computer 16, but may be coupled to computer 16 such that the measurements obtained at the time measurement device are appropriately relayed to the computer workstation for subsequent processing.

Figure 8:
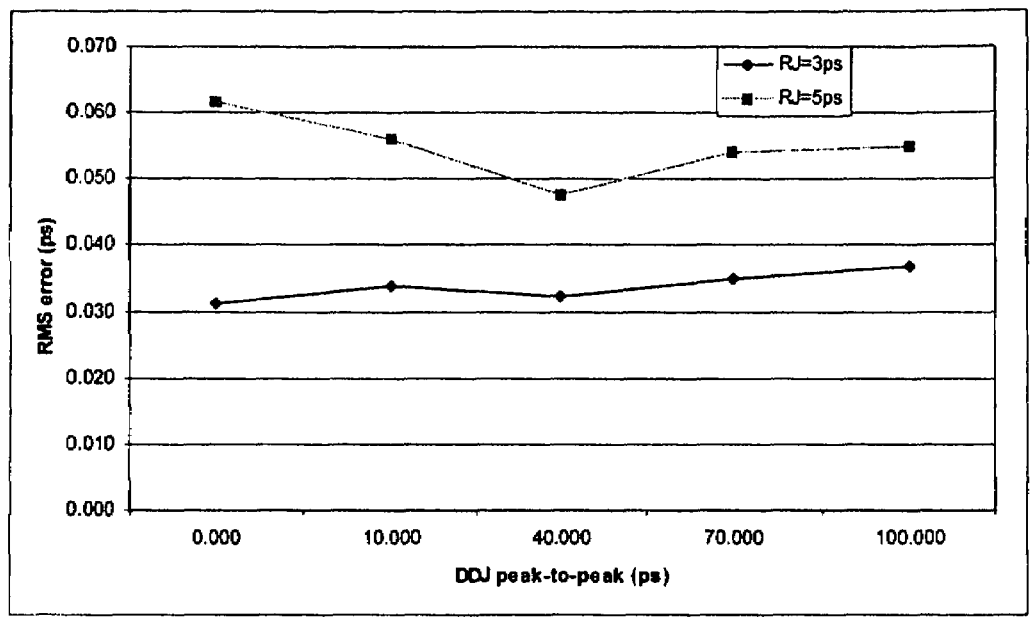
FIG. 8 provides an exemplary graphical representation of RMS estimation error versus peak-to-peak data-dependent jitter for given amounts of random jitter obtained via measurement techniques in accordance with the presently disclosed technology.
Figure 9:
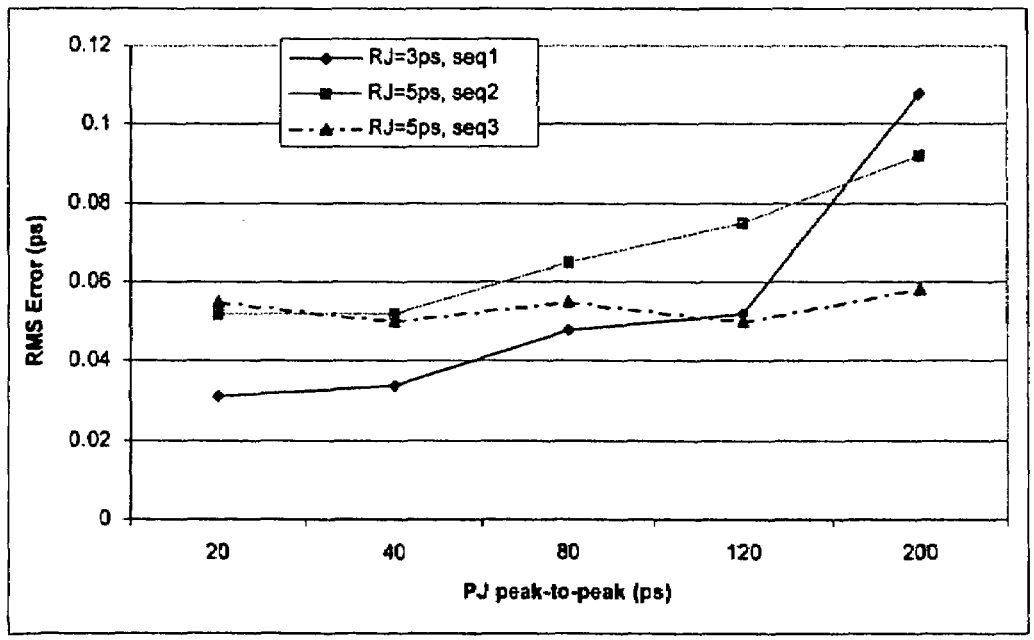
FIG. 9 provides an exemplary graphical representation of RMS estimation error versus peak-to-peak periodic jitter for given amounts of random jitter obtained via measurement techniques in accordance with the presently disclosed technology.

It should be appreciated that the RJ estimation techniques described herein with accordance to aspects of the presently disclosed technology provide significant advantage over other known methods for obtaining RJ estimates. FIGS. 8 and 9 show the accuracy and precision of RJ estimate of this method for different values of DDJ and PJ. As the plots illustrate, the subject method provides very accurate and consistent RJ estimates even in the presence of large DDJ and PJ. It also converges to a precise result with much less number of samples than algorithms such as tail fit, because it uses the RJ information embedded in all samples, rather than relying on a small subset of samples on the pdf tail. The subject methodology provides an estimate of total RJ, including non-Gaussian components, if there are any. Depending on the distribution of such RJ, their inclusion in total RJ may improve bit-error-rate estimates or provide conservative BER estimates.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of estimating random jitter from measured samples of a transmitted data signal, said method comprising the following steps:
   obtaining a plurality of measurements, using at least one measurement channels system, for a plurality of selected signal edges within a transmitted data stream, wherein the transmitted data stream comprises a repeating data pattern, wherein each iteration of the data pattern has a given number of multiple pulses, wherein each iteration of the data pattern does not correspond to uniform repetition of a single pulse, and wherein the time difference between adjacent measurements is determined by an event count increment equal to an integer multiple (M) of the given number of multiple pulses within the repeating data pattern;
   computing a time interval error (TIE) value, using a processor circuit, for each measured signal edge in said obtaining step;
   transforming TIE values, using the processor circuit, into corresponding TIE components for selected of the measured signal edges, wherein said TIE frequency components are representative of both noise floor as well as multiple distinct frequency peaks;
   separating the noise floor from the multiple distinct frequency peaks, using the processor circuit;
   computing the power of the noise floor within the TIE frequency components, using the processor circuit; and
   providing an output indicative of the computed power of the noise floor to obtain an estimate of the random jitter variance using the processor circuit.

2. The method of claim 1, wherein said step of computing a time interval error value for each measured signal edge further comprises the following steps:
   obtaining a unit interval value corresponding to the average bit rate for the transmitted data stream;
   computing an ideal edge timing for each measured signal edge from the obtained unit interval value; and
   determining the difference between the calculated ideal edge timing and the actual measured timing for each measured signal edge.

3. The method of claim 1, further comprising a step of adding zero values to the collection of measurements from said obtaining step such that the total number of measurements including added zero values is equal to a power of two.

4. The method of claim 1, wherein said transforming step comprises performing a fast Fourier transform.

5. The method of claim 1, wherein said step of separating the noise floor from the multiple distinct frequency components further comprises the step of replacing each TIE frequency component greater than a predetermined value with a lower predetermined replacement value.

6. The method of claim 1, further comprising a step of determining random jitter standard deviation by taking the square root of the computed power in the noise floor.

7. The method of claim 1, further comprising the step before said transforming step of applying a windowing function w(m) to each computed time interval error value.

8. The method of claim 7, further comprising a step of computing a windowing power loss compensation factor $k_2$ defined as:

$$k_2 = \sqrt{\frac{N}{\sum_{m=1}^{N} [w(m)]^2}}.$$

9. The method of claim 1, wherein the transmitted data stream comprises a repeating data pattern having a known bit length and known number of rising edges and wherein the plurality of measurements obtained for a plurality of selected signal edges within a transmitted data stream include pulse width measurements for multiple copies of a selected rising edge within the repeating data pattern and the immediately subsequent falling edge.

10. The method of claim 9, wherein said steps of computing time interval error, performing a fast Fourier transform, separating the noise floor and computing the power of the noise floor are performed in two iterations, once for the combined sequence of measured rising edges and once for the combined sequence of measured falling edges, and wherein said method further comprises a step of averaging the two values obtained for the power of the noise floor in each respective iteration of steps.

11. The method of claim 1, wherein the integer multiple (M) is at least one order of magnitude greater than the number of multiple pulses in the transmitted data stream.

12. The method of claim 1, wherein the repeating data pattern of the transmitted data stream is capable of representation in a binary format as a predetermined sequence of ones and zeros, wherein the ones and zeros in a given iteration of the data pattern are not sequentially ordered in a manner whereby every string of zeros has the same bit length and is immediately followed by a string of ones of the same bit length.

13. The method of claim 1 wherein the repeating data pattern of the transmitted data stream is capable of representation in a binary format as a predetermined sequence of ones and zeros, and wherein the number of zeros in a given iteration of the data pattern is not equal to the number of ones.

14. A measurement system configured to obtain random jitter estimates for a transmitted signal, said measurement system comprising:
   at least one measurement channel for obtaining multiple respective start and stop measurements for selected signal edges within the transmitted data signal, wherein the transmitted data signal comprises a repeating data pattern of multiple pulses having a known bit length and known number of multiple rising edges, wherein each iteration of the data pattern does not correspond to uniform repetition of a single pulse, and wherein the time difference between adjacent start measurements is determined by an event count increment equal to an integer multiple (M) of the known number of multiple rising edges within the repeating data pattern; and
   a processor circuit coupled to said at least one measurement channel, said processor circuit configured to determine the time interval error for each start and stop measurement, to transform selected of the time interval error values into corresponding TIE frequency components, to separate noise floor from multiple distinct frequency peaks in the TIE frequency components, and to compute the power of the noise floor within the TIE frequency components to obtain an estimate of random jitter variance.

15. The measurement system of claim 14, wherein said measurement system further comprises an event counter to determine an event count increment equal to an integer multiple of the known number of rising edges, whereby the event count increment is measured by said event counter between immediately subsequent measurements obtained by said at least one measurement channel.

16. The measurement system of claim 15, wherein the plurality of respective start and stop measurements obtained by said at least one measurement channel correspond to pulse width measurements for multiple copies of a selected rising edge within the repeating data pattern and the immediately subsequent falling edge.

17. The measurement system of claim 14, wherein said at least one measurement channel comprises a pair of comparators, multiplexers and interpolators coupled to a continuous time counter and a continuous event counter.

18. The measurement system of claim 14, wherein said processor circuit comprises:
    a computer-readable medium for storing executable instructions corresponding to the steps of determining the time interval error for each start and stop measurement, transforming selected of the time interval error values into corresponding TIE frequency components, separating noise floor from multiple distinct frequency peaks in the TIE frequency components, and computing the power of the noise floor within the TIE frequency components; and
    a computer coupled to said computer-readable medium for executing the instructions stored therein.

19. The measurement circuit of claim 18, wherein said computer-readable medium comprises one or more of a server database, a magnetic tape or disk, a CD-ROM, a flash or other nonvolatile memory.

20. A method of determining the random component of a jitter signal, said method comprising the steps of:
    creating a uniform sampling environment, using at least one measurement channels system, for obtaining a plurality of jitter measurements associated with a transmitted data stream, wherein said jitter measurements are performed by obtaining a time stamp and event count for selected signal edges within the transmitted data stream;
    performing a time domain data-dependent jitter (DDJ) deconvolution, using a processor circuit, such that DDJ is eliminated from the jitter measurements;
    performing a frequency domain periodic jitter (PJ) deconvolution, using the processor circuit, to transform the jitter measurements from a time domain to a frequency domain representation and minimize PJ components of the frequency domain representation; and
    computing the power in noise floor present in the frequency domain representation to obtain, using the processor circuit, to obtain an estimate of random jitter (RJ) variance.

21. The method of claim 20, wherein said step of performing a time domain DDJ deconvolution comprises computing DDJ for selected jitter measurements and substracting the computed DDJ amount from the respective selected measurements.

22. The method of claim 20, wherein the transmitted data stream comprises a repeating data pattern having a known bit length and known number of rising edges, and wherein said step of obtaining a uniform sampling environment comprises waiting an event count increment equal to an integer multiple of the known number of rising edges between adjacent measurements.

23. The method of claim 20, wherein jitter measurements are transformed in said step of performing a frequency domain periodic jitter (PJ) deconvolution by performing a fast Fourier transform.

24. The method of claim 20, wherein said step of performing a frequency domain periodic jitter (PJ) deconvolution comprises separating noise floor from multiple distinct frequency components present in the frequency domain representation by replacing each frequency domain component greater than a predetermined value with a lower predetermined replacement value.

25. The method of claim 20, further comprising a step of determining random jitter standard deviation by taking the square root of the RJ variance.

26. The method of claim 20, wherein the transmitted data stream comprises a repeating data pattern having a known bit length and known number of rising edges and wherein the plurality of jitter measurements obtained for a plurality of selected signal edges within a transmitted data stream include pulse width measurements for multiple copies of a selected rising edge within the repeating data pattern and the immediately subsequent falling edge.

27. The method of claim 26, wherein said steps of performing a time domain data-dependent jitter (DDJ) deconvolution, performing a frequency domain periodic jitter (PJ) deconvolution, and computing the power in noise floor present in the frequency domain representation are performed in two iterations, once for the combined sequence of measured rising edges and once for the combined sequence of measured falling edges, and wherein said method further comprises a step of averaging the two values obtained for the power of the noise floor in each respective iteration of steps.

* * * * *